United States Patent
Ozgur et al.

(10) Patent No.: US 8,983,414 B2
(45) Date of Patent: Mar. 17, 2015

(54) VERSATILE COMMUNICATION SYSTEM AND METHOD OF IMPLEMENTATION USING HETEROGENEOUS INTEGRATION

(71) Applicant: Corporation for National Research Initiatives, Reston, VA (US)

(72) Inventors: Mehmet Ozgur, Reston, VA (US);
Michael Pedersen, Ashton, VA (US);
Michael A. Huff, Oakton, VA (US)

(73) Assignee: Corporation for National Reseach Initiatives, Reston, VA (US)

( * ) Notice: Subject to any disclaimer, the term of this patent is extended or adjusted under 35 U.S.C. 154(b) by 81 days.

(21) Appl. No.: 13/914,144

(22) Filed: Jun. 10, 2013

(65) Prior Publication Data
US 2013/0344819 A1    Dec. 26, 2013

Related U.S. Application Data

(60) Provisional application No. 61/657,320, filed on Jun. 8, 2012.

(51) Int. Cl.
| | |
|---|---|
| H04B 1/18 | (2006.01) |
| H04B 1/40 | (2006.01) |
| H01L 25/00 | (2006.01) |
| H01L 23/00 | (2006.01) |
| H03H 9/02 | (2006.01) |
| H03H 9/60 | (2006.01) |
| H01L 23/538 | (2006.01) |
| H03H 3/02 | (2006.01) |
| H03H 9/70 | (2006.01) |

(52) U.S. Cl.
CPC ........ *H04B 1/40* (2013.01); *H01L 25/50* (2013.01); *H01L 24/24* (2013.01); *H03H 9/02228* (2013.01); *H03H 9/605* (2013.01); *H01L 2224/24137* (2013.01); *H01L 2924/13064* (2013.01); *H01L 23/5389* (2013.01); *H03H 3/02* (2013.01); *H03H 9/70* (2013.01)
USPC .............. 455/187.1; 700/90; 330/250

(58) Field of Classification Search
USPC .......... 455/187.1, 178.1, 187.9, 191.1, 197.3, 455/333; 700/90
See application file for complete search history.

(56) References Cited

U.S. PATENT DOCUMENTS

| | | | | |
|---|---|---|---|---|
| 7,542,812 | B2* | 6/2009 | Stroili et al. | 700/90 |
| 8,185,221 | B1* | 5/2012 | Stroili et al. | 700/90 |
| 8,660,671 | B2* | 2/2014 | Stroili et al. | 700/90 |
| 2009/0093270 | A1* | 4/2009 | Block et al. | 455/552.1 |
| 2014/0002187 | A1* | 1/2014 | McPartlin et al. | 330/250 |
| 2014/0003000 | A1* | 1/2014 | McPartlin | 361/728 |

* cited by examiner

*Primary Examiner* — Minh D Dao
(74) *Attorney, Agent, or Firm* — Nixon & Vanderhy, P.C.

(57) ABSTRACT

A communication system front-end architecture and a method of fabricating same are disclosed in which a diverse set of semiconductor technologies and device types (including CMOS, SiGe CMOS, InP HBTs (heterojunction bipolar transistors), InP HEMTs (high electron mobility transistors), GaN HEMTs, SiC devices, any number from a diverse set of MEMS sensors and actuators, and potentially photonics) is merged onto a single silicon, or other material substrate to thereby enable the development of smaller, lighter, and higher performance systems.

44 Claims, 9 Drawing Sheets

The digital control circuit is revised as "mixed signal circuit". The control circuit is connected to all devices to reconfigure them as needed to achieve the versatile communication system The digital control circuit is revised as "mixed signal circuit". The control circuit is connected to all devices to reconfigure them as needed to achieve the versatile communication system

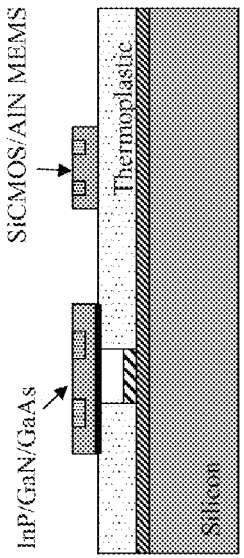
FIG. 9A
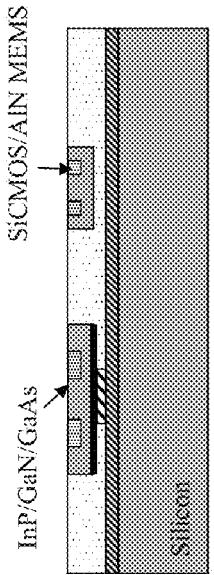
FIG. 9B
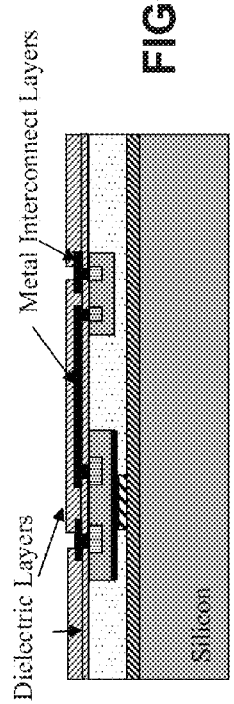
FIG. 9C
FIG. 9D
FIG. 9E
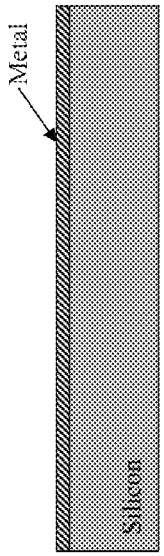
FIG. 9F
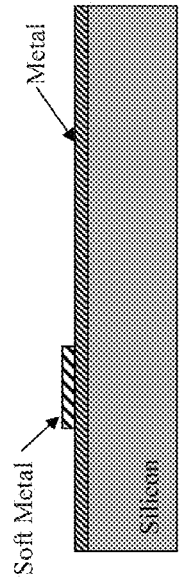
FIG. 9G
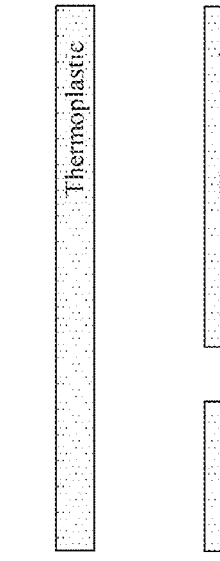
FIG. 9H
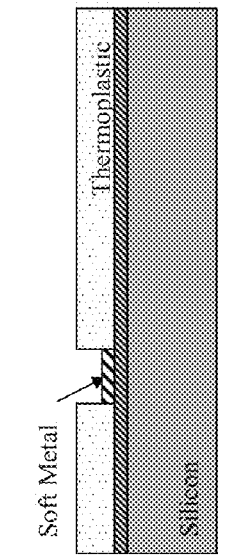
FIG. 9I

VERSATILE COMMUNICATION SYSTEM AND METHOD OF IMPLEMENTATION USING HETEROGENEOUS INTEGRATION

This application claims the benefit of U.S. Provisional Application No. 61/657,320, filed, Jun. 8, 2012, the entire contents of which are incorporated herein by reference.

The present invention is directed to communication systems, and more particularly to a A communication system front-end architecture in which a diverse set of semiconductor technologies and device types (including CMOS, SiGe CMOS, InP HBTs (heterojunction bipolar transistors), InP HEMTs (high electron mobility transistors), GaN HEMTs, SiC devices, any number from a diverse set of MEMS sensors and actuators, and potentially photonics) is merged onto a single silicon, or other material substrate to thereby enable the development of smaller, lighter, and higher performance systems.

BACKGROUND OF THE INVENTION

There is increased need and market demand for communication systems that can operate in multiple frequency bands as well as using different modulation techniques. Additionally, the military is very interested in having the ability to operate securely at any frequency at any time. An important application area that requires adaptability and versatility are cellular communication systems. The software-defined radio (SDR) concept has long been recognized as a desirable system configuration for versatile communication systems and has been driving architectural innovation in recent years.

An important need in the development of the SDR concept is the integration of vastly different semiconductor technologies, including: Gallium Nitride (GaN), Indium Phosphide (InP), Gallium Arsenide (GaAs), silicon Complementary Metal-Oxide Semiconductor (CMOS), and Silicon-Germanium CMOS. While solid-state electronics have advanced in many ways over the years, differentiation due to very specific technical and/or economical requirements has resulted in significant process differences. Consequently, in the foreseeable future it is unlikely to see convergence between even silicon-based process sequences, let alone between non-Silicon process technologies. Therefore, the desire to integrate MEMS (microelectromechanical systems), various flavors of active Si, SiGe, GaAs, GaN, and InP technologies, along with passive electromagnetic, optical, acoustic, and magnetic processes is very much in need.

BRIEF DESCRIPTION OF THE INVENTION

The present invention presents a unique approach to realizing a versatile communication system using a software-defined radio by the implementation, use, and integration of several critical technologies. The present invention also concerns a method of implementation for the heterogeneous integration of a diverse set of devices and systems. Heterogeneous integration, in which a diverse set of semiconductor technologies and device types (including CMOS, SiGe CMOS, InP HBTs (heterojunction bipolar transistors), InP HEMTs (high electron mobility transistors), GaN HEMTs, SiC devices, any number from a diverse set of MEMS sensors and actuators, and potentially photonics) is merged onto a single silicon, or other material substrate, is a revolutionary technology that enables the development of smaller, lighter, and higher performance systems. Although the benefits of heterogeneous integration technology are clearly very substantial, there have been significant technological challenges related to fabrication and manufacturing technologies that must be successfully overcome for this technology to be successful and this invention addresses these challenges.

The present invention for purposes of heterogeneous integration is an all encompassing technology that can be used to combine any number of material-base devices, including any compound semiconductor devices and systems (e.g., InP, GaN, GaAs, SiC, etc.), MEMS, or any technology as desired, all on a single silicon or other material substrate. This technology is a unique approach that allows maximum flexibility with respect to source materials, while achieving sufficient properties for the intended applications, such as signal bandwidth for RF applications, thermal management for high power electronics, all in a rugged planar assembly. Additionally, this technology is manufacturable, low in cost, and uses existing process tool resources.

The heterogeneous integration process technology of the present invention satisfies each of these goals, and more, and is a revolutionary implementation vehicle for planar monolithic heterogeneous integration of an enormously comprehensive and diverse set of important and useful device technologies (e.g., potentially all of those already in existence, as well as other technologies that are developed in the foreseeable future) for an equally diverse set of semiconductor technologies, including silicon, MEMS, and compound semiconductors (e.g., InP, GaN, GaAs, etc.). The process technology of the present invention can be easily installed in any foundry without major development or re-tooling costs. The technology of the present invention is so broad-based, that it will accelerate the use of heterogeneous integration technology for exploitation in a broad and diverse array of important defense and commercial industries.

BRIEF DESCRIPTION OF THE DRAWINGS

FIG. 7A shows a silicon carrier substrate onto which a thermoplastic polymeric material layer is bonded or laminated; FIG. 7B shows completed CMOS, InP, GaN, GaAs, MEMS, etc. devices (i.e., die or microchips) placed face up on top of the polymeric material layer; FIG. 7C shows the devices embossed into the thermoplastic material layer using hot embossing technology; and FIGS. 7D through 7F show multiple dielectric and metal layers fabricated on a planar front surface on the silicon substrate using standard lithographic methods to form complex interconnection schemes between the devices.

FIGS. 9 A to 9I show an alternative concept of planar heterogeneous integration technology. Specifically, FIG. 9A shows a carrier wafer on the surface of which a thin film of metal is deposited; FIG. 9B shows a relatively soft metal layer deposited on the metal thin film and then patterned; FIG. 9C shows a thermoplastic layer; FIG. 9D shows the thermoplastic layer patterned to make holes through its thickness in a desired location(s); FIG. 9E shows the thermoplastic layer aligned and bonded or laminated to the carrier wafer, such that the patterned soft metal on the wafer surface is located where the through-holes are in the thermoplastic layer; FIG. 9F shows the die to be embossed into the thermoplastic layer positioned on the top surface of the thermoplastic layer. FIG. 9G shows the die hot embossed into the thermoplastic layer, such that their top surfaces are even with the top surface of the thermoplastic layer and the metal layer on the backside of the die being pushed into physical contact with the buried soft meal layer; and FIGS. 9H and 9I show various thin film layers of metals and dielectrics deposited and patterned to form various electrical interconnects between various die.

DETAILED DESCRIPTION OF THE INVENTION

The present invention uses a unique approach to realizing a versatile communication system using a software-defined radio by the implementation, use, and integration of several critical technologies.

Figure 1:
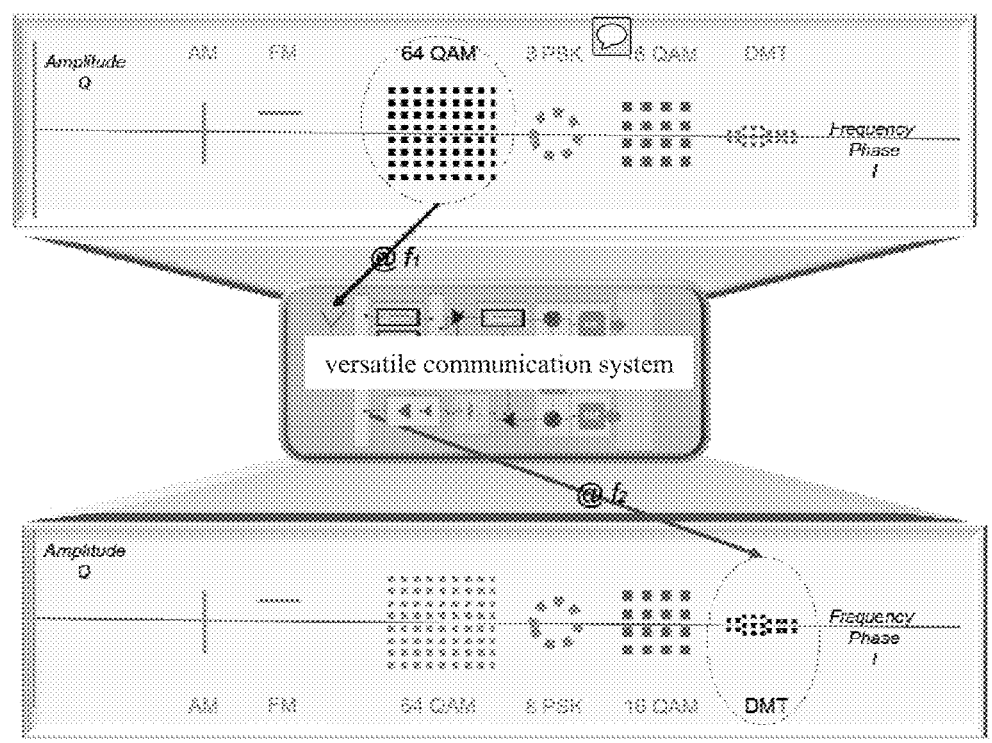
FIG. 1 shows a versatile communication system that is capable of receiving any modulated waveform at any frequency, and, using software-defined/controlled architecture, that can also generate any waveforms for transmission at different frequency bands.

The software-defined radio (SDR) concept has long been recognized as a desirable system configuration for versatile communication systems and has been driving architectural innovation in recent years. The primary objective is to define/control communication channels by software (see FIG. 1) so that the resulting radio is capable of receiving and generating a variety of waveforms in different frequency bands, different power levels, and different dynamic ranges. FIG. 1 shows a versatile communication system 10 that is capable of receiving any modulated waveform at any frequency. Using software-defined/controlled architecture, this system can also generate any waveforms for transmission at different frequency bands.

The present invention also concerns a novel integration method and an optimum blend of five different technologies to achieve the best SNR (signal-to-noise ratio), highest tunability/configurability in the receive chain, and highest power efficiency and tunability in the transmit channel.

Figure 2:
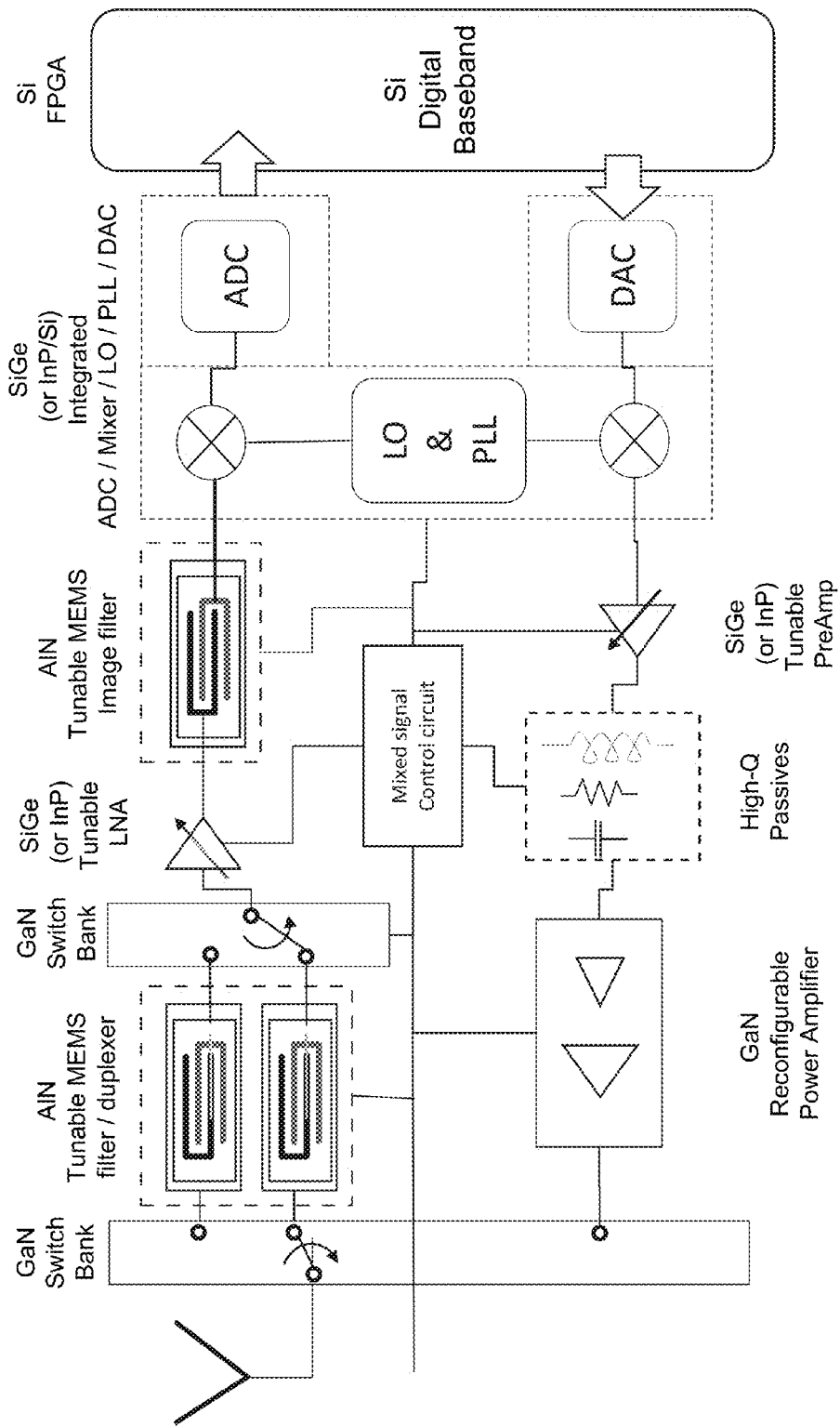
FIG. 2 shows a versatile communication system front-end architecture in which GaN HEMI, SiGe BiCMOS (or InP HBT), low-power Si CMOS, AlN MEMS, and High-Q passives are all integrated together.

The versatile communication systems architecture is illustrated in FIG. 2. FIG. 2 shows a versatile communication system front-end architecture in which GaN HEMT, SiGe BiCMOS (or InP HBT), low-power Si CMOS, AlN MEMS filters, and High-Q passives are all integrated together. The design includes three IC (integrated circuit) (or active) technologies and two non-IC (or passive) technologies. The IC technologies and their advantages are listed in Table 1 shown below.

TABLE 1

| Technology | Device use | Advantage |
|---|---|---|
| 0.25 uM GaN On SiC (limited release) | Switches, PA | Power density (5-7 W/mm), Efficiency (PAE 50-75%) |
| 0.13 um/0.18 um SiGe (IBM/TowerJazz) | LNA. ADC, VCO Mixer | Circuit density, cost, Ft, integrated passives |
| 40 nm/90 nm Si CMOS (TSMC) | FPGA (field programmable gate array), DSP (digital signal processing), Logic | Circuit density, low-power performance |

Currently the most advanced IC technologies are not sufficient to build a fully functional radio-front-end. Several high-quality discrete components are also required. Some of these components, such as capacitors, inductors, resistors, and transmission-line elements, can also be made on GaN and SiGe technologies; however, the size of these components could be substantial. Considering the fabrication cost per unit area, it is far more cost-effective to fabricate large passive components on a separate substrate. This does not mean that all passives in amplifiers and other active parts will be moved to another substrate. Ultimately, the location of passives is determined by the design and electromagnetic environment of the integration medium. Nevertheless, having a high-Q passive on a separate substrate provides additional design freedom necessary for front-end design.

Another key passive component in the design is high-quality resonators, which require very specific process technologies such as SAW (surface acoustical wave) and FBAR (film bulk acoustic resonator). These resonators are essential to filter unwanted signals so that the nonlinearity of the active devices does not add spurious signals and noise to the desired part of the signal. The system of the present invention uses a novel tunable AlN (Aluminum Nitride) resonator technology that can be integrated with CMOS wafers by post-processing CMOS wafers. The AlN material layer deposition is performed at temperatures below 400 C and therefore is CMOS compatible. The two passive technologies are listed in Table 2 shown below.

TABLE 2

| Technology | Device use | Advantage |
|---|---|---|
| High-Q passives | R, L, C | High-Q, cost |
| Integrated AlN resonators | Filters, ref. resonator | High-Q, tunability, integration, cost |

The versatile communication system integrates several innovative technologies. These are listed as follows:
1) Integrated tunable AlN resonators (RF filters, IF filters, reference resonator);
2) GaN switches (circuit configuration);
3) Integrated SiGe tunable LNA (low noise amplifier), Mixer, VCO (voltage controlled oscillator) (with off-chip passives);
4) Low-power SiGe (or Si) ADC;
5) Linearized, tunable SiGe PreAmp, GaN PA (with off-chip passives); and
6) High-Q passives.

Each of the technologies used in this system is described below:
1) Integrated AlN Resonators.
High-quality resonators are essential components in the RF front-end of the versatile communication system. When used as a filter, their out-of-band rejection is unmatched and their in-band losses are very low. Of two competing technologies, SAW devices are relatively large and their fabrication technology is matured. More importantly, due to their method of fabrication and packaging they will remain as discrete components for the foreseeable future. The second technology, FBAR, is based on thin-film processing of piezoelectric materials such as AlN. They are smaller and more complicated to make than the SAW devices. Almost all FBAR devices in the market rely on acoustic waves in traveling within the thickness of the film; hence, the film thickness becomes the key factor in determination of the resonant frequency. From the fabrication point of view, this approach is ideal to make single frequency resonators. However, each additional new frequency band will require a modified fabrication sequence which increases the cost significantly.

A preferred version of the metal-piezoelectric-metal sandwich can be used to generate an in-plane mode of excitation. Then, the frequency can be controlled by the size of the electrodes lithographically, which is a significant advantage. The acoustic waves generated in this configuration are known as Lamb waves.

Figure 3:
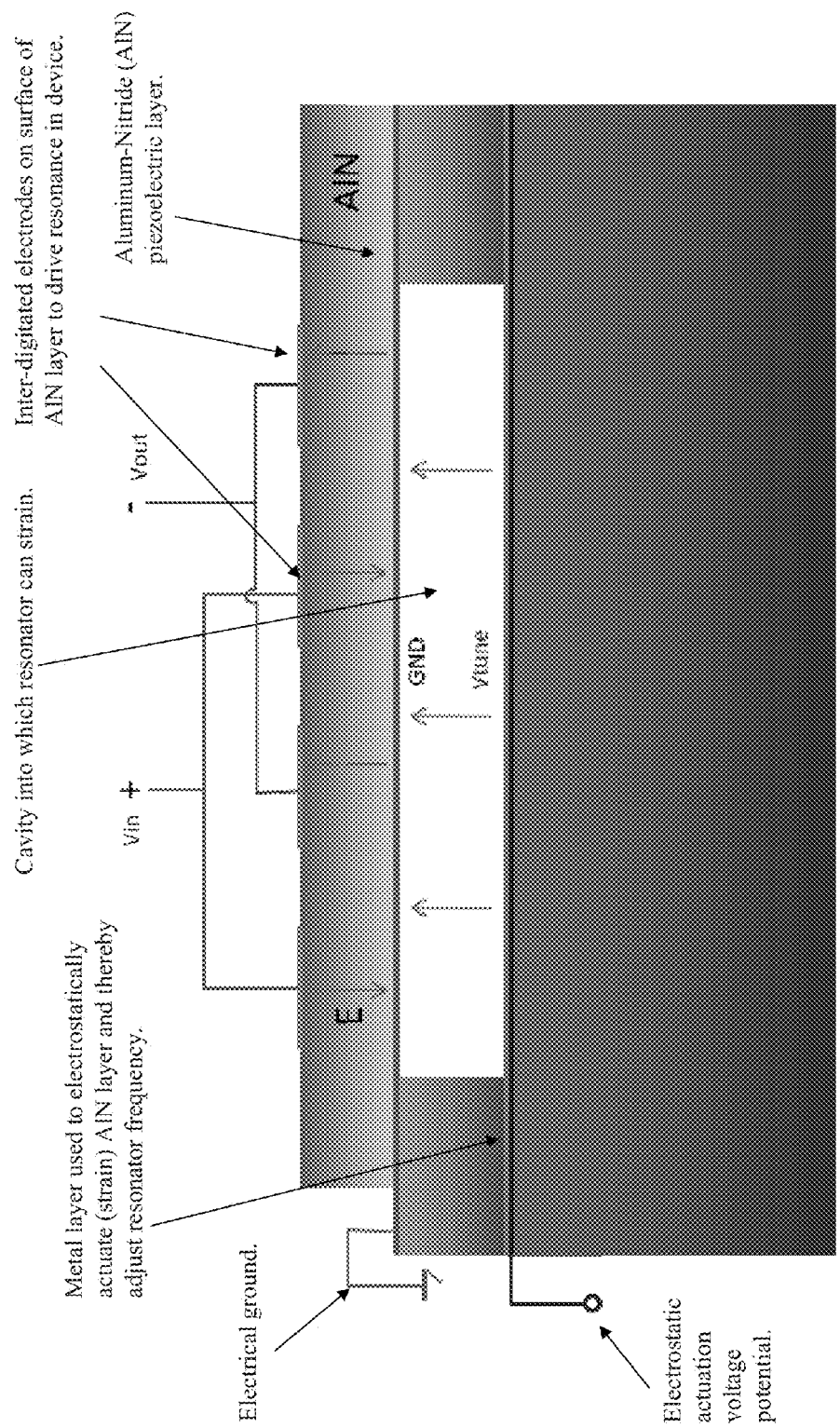
FIG. 3 shows a tunable, thin-film AlN RF resonator that includes a completely released AlN deposited on uniform ground metallization, and excited with two sets of top electrodes (in-plane-Lamb waves). The third ground electrode is underneath the AlN is necessary to drive the excitations and a fourth electrode on the substrate is required for frequency tuning.

In order to be able to fabricate multiple frequency resonators from the same process and have those frequency tunable would be a tremendous advantage, in fact, a very desirable feature for the versatile communication system radio front-end. A new architecture illustrated in FIG. 3 illustrates this device. It relies on lamb-mode waves but also includes a third electrode below the ground plane to modify the wave propagation by inducing additional strain in the piezoelectric thin film. Thus, FIG. 3 shows a tunable thin-film AlN RF resonator which includes a completely released AlN deposited on uniform ground metallization, and excited with two sets of top electrodes (in-plane-Lamb waves). All materials and processes are compatible with CMOS devices. The top electrodes can be symmetric, so as to allow either set to be used to drive the resonator. The other set of top electrodes are used for sensing, hence forming the output port of the resonator.

Figure 4:
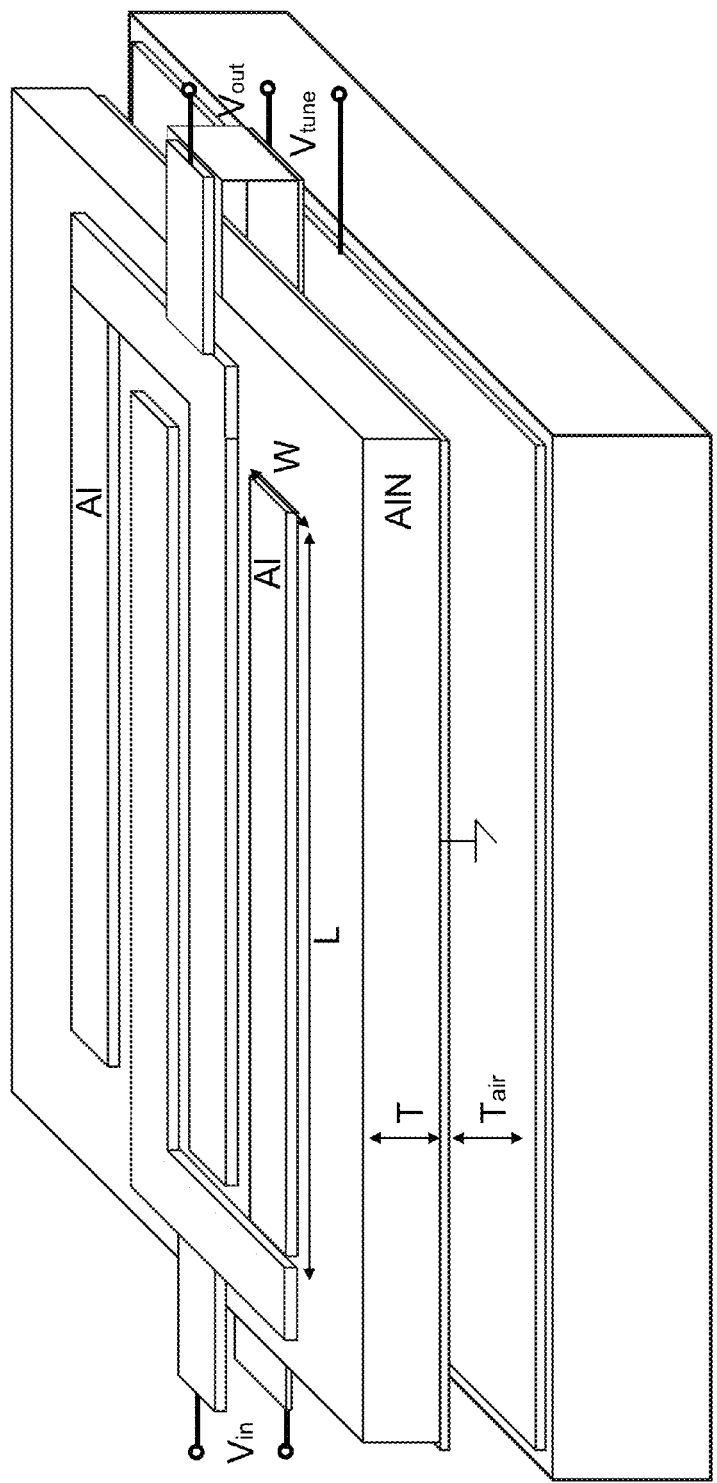
FIG. 4 shows a perspective view of a tunable, thin-film AlN resonator with two sets of top electrodes, ground electrode and a fourth electrode for frequency tuning.

The sound waves propagate between the input and output ports, but due to mechanical properties, only frequencies at the resonant frequency Fr transmits through. In addition to the material properties of AlN, the key factor that determines the resonant frequency is the width of the finger (shown as W in FIG. 4). Nevertheless, the material properties can be modified with Vtune voltage applied across the air gap Tair between the electrode directly underneath AlN thin film and electrode on the substrate below. The electrostatic force will pull the suspended resonator film stack, hence mechanically straining AlN, therefore changing its mechanical properties. This changes the sound propagation properties, therefore resulting change in the resonant frequency Fr.

Figure 5:
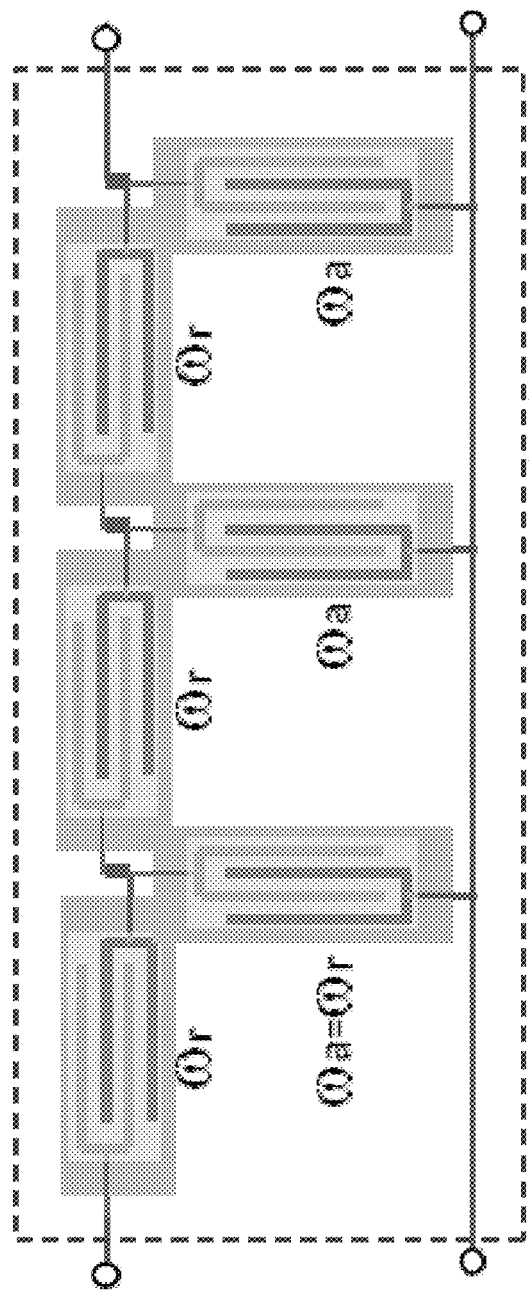
FIG. 5 shows a schematic view of a single-ended, three-stage ladder filter design based on AlN resonators.

By combining small, high-Q resonators in a traditional ladder filter configuration (see FIG. 5), filters with center frequencies covering in the range of 0.8 GHz to 5 GHz with quality factors >1000 can be realized. Additionally, it is possible to extend the tuning range of these filters to a few hundred of MHz as well as to tens of GHz. Thus, FIG. 5 shows a schematic view of a single-ended, three-stage ladder filter design based on tunable AlN resonators. Here the resonance of the series resonators ($\omega_r$) is tuned to the anti-resonance frequency of shunt resonators ($\omega_a$). The resulting bandwidth is determined by the ratio of mechanical and electrical capacitance (or effective electromechanical coupling) of the resonators. The quality factor is >1000.

One of the benefits of the AlN resonator technology is that it is compatible with CMOS processing. Ultimately, these resonators can be fabricated directly on CMOS wafers.

2) GaN Switches.

GaN switches with higher power handling capability, lower resistance, and proven reliability are used to switch in/out passive components; hence, providing necessary versatility to control waveforms in the desired range.

3) Integrated SiGe LNA, Mixer, VCO.

Integration of active front-end components has been one of the biggest advantages of SiGe BiCMOS processes. With the addition of higher quality passives, GaN switches and AlN resonators, the integrated SiGe module is even more capable.

Demonstration of GaN, AlN, SiGe integration in the receive chain is a key and necessary accomplishment.

4) Low-Power SiGe BiCMOS (or Si CMOS) ADC

Figures 6A, 6B:
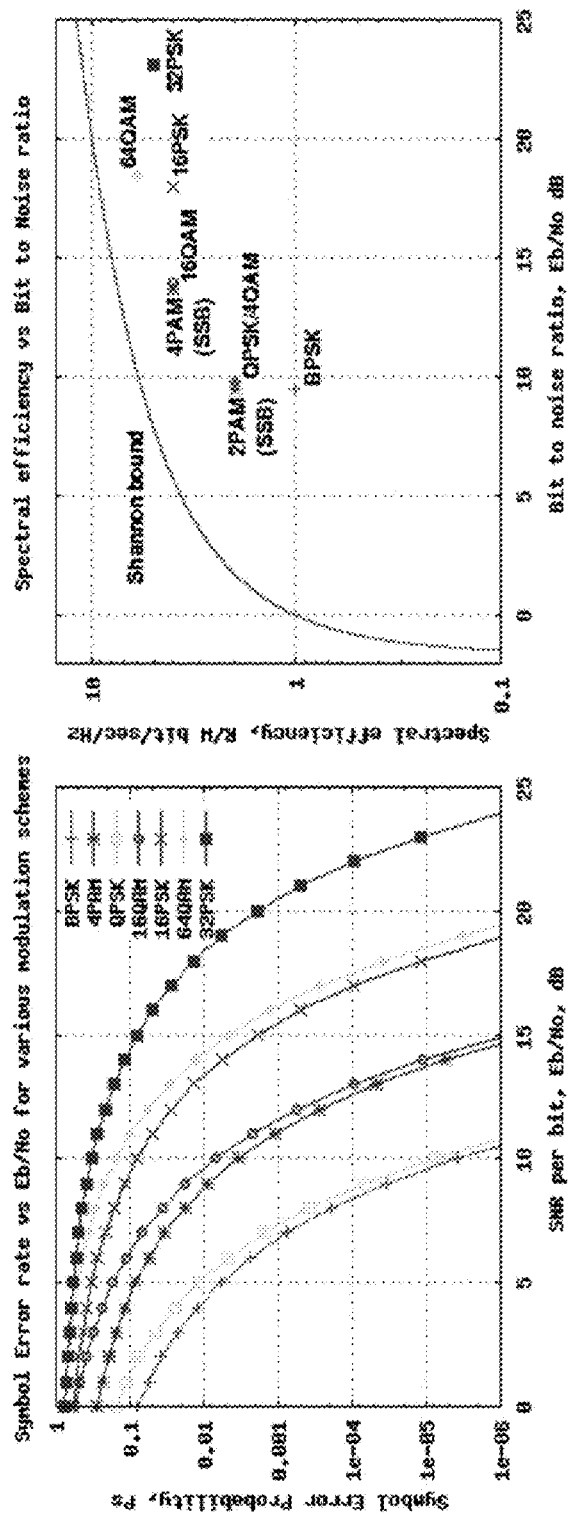
FIG. 6A shows the signal to noise ratio (SNR) requirements of various modulations and FIG. 6B shows the spectral efficiencies of the various modulations.

The main objective in SDR architectures is to place ADC (analog-to-digital converters) as close to the antenna in the receive chain as possible. In all architectures (low-IF, zero-IF or bandpass-sampling), the required dynamic range and corresponding SNR for an ADC are quite high. FIGS. 6A and 6B show, respectively, SNR requirements and spectral efficiencies of various modulations. From calculations presented in FIG. 6B for 64QAM (quadrature amplitude modulator) modulation, the Bit to Noise ratio (Eb/No) required for achieving $10^{-5}$ symbol error rate symbol error probability of is 18.5 dB[1]. Therefore, the required SNR (FIG. 6A) for the receive channel is ~111 dB. Commercially available high-speed ADCs[2] cannot support the required SNR for 64QAM. They are sufficient for only 16QAM modulated signals. Considering other key specifications of ADCs, such as bandwidth, power consumption and cost, the scale of the challenge can be easier to understand.

[1] Proakis, Salehi, "Fundamentals of Communication Systems", Prentice hall, 2004.
[2] High-speed ADCs, TI, http://www.ti.com/apps/docs/viewdevices.tsp?blockDiagramId=6091&blockId=12509&designOptionId=16222&appId=357

More recently, significant improvements have been reported in low-power ADC designs[3]. Verbruggen et al. reported a 250 MS/s ADC implemented at 40 nm CMOS process which had ~55 dB SNR @100 MHz input frequency. This is achieved @1.7 mW consumption. It is believed that this and similar studies that showed low-power, two-stage, SAR-type (successive approximation register-type) ADCs are good candidates for an ADC that can be used in a mobile platform. It is also believed that advanced, low-power CMOS or SiGe BiCMOS technologies would be ideal to implement >65 dB SNR @250 MS/s ADCs with <10 mW power consumption. A receive channel that use such an ADC will be capable of operating with 16QAM at symbol error rates $<10^{-5}$.

[3] High-speed ADCs, TI, http://www.ti.com/apps/docs/viewdevices.tsp?blockDiagramId=6091&blockId=12509&designOptionId=16222&appId=357

Demonstration of ADC with 100 MHz bandwidth, SNR of >65 dB and power consumption <10 mW is another important accomplishment in the receive chain.

5) Linearized, Tunable SiGe PreAmp, GaN Power Amplifier

Arguably, one of the most challenging parts of the radio front-end design is to make a power efficient, and highly-linear power amplifier. Combining circuit speed and complexity of SiGe and inherent advantages of GaN a hybrid amplifier can be realized, where the GaN amplifier is closely monitored and driven by the SiGe preamplifier to optimize the performance specs.

6) High-Q Passives

Three level thick metallization on a fused-silica substrate is used to implement high-Q passives. Specialty films such as NiCr for resistors, and high-density capacitive films, such as $Al_2O_3$, and $HfO_2$, can also be included to achieve resistive and capacitive components.

Figure 7A:
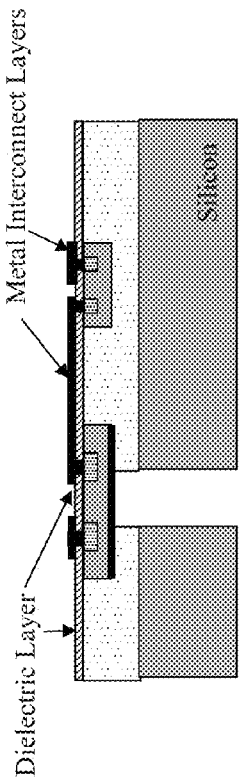
FIGS. 7A to 7F show the basic concept of planar heterogeneous integration technology. Specifically.
Figure 7B:
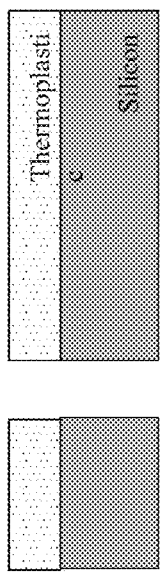
Figure 7D:
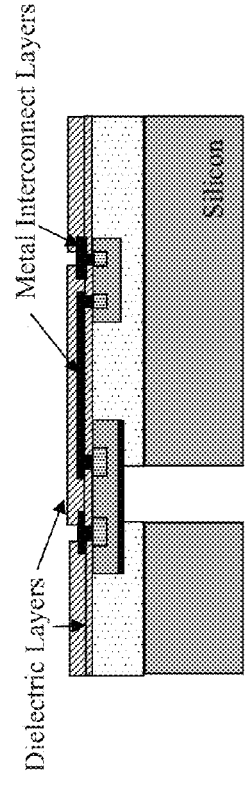
Figure 7C:
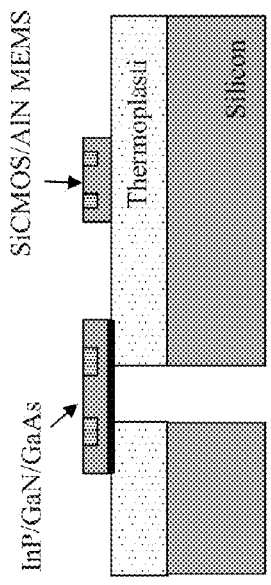
Figure 7E:
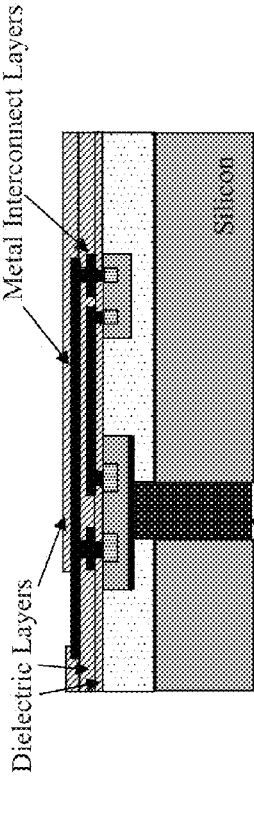
Figure 7F:
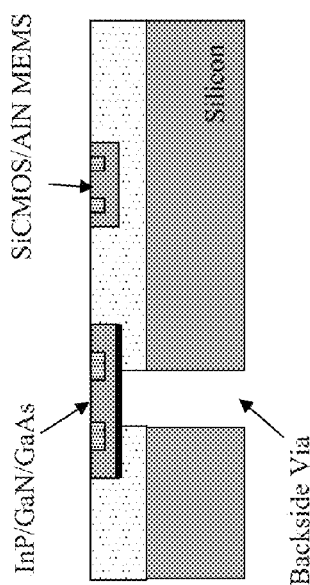

The present invention also relates to a new, all encompassing method that is a process technology that allows planar heterogeneous integration of any number of material-base devices, whether they be Si CMOS, SiGe CMOS, InP HBTs, InP HEMTs, GaAs HEMTs, MESFETs, GaN HEMTs, SiC devices, any number from a diverse set of MEMS sensors and actuators, and potentially photonics, onto a single silicon, or other suitable material, substrate. The technology is a unique approach to allow for maximum flexibility with respect to source materials and is completely agnostic to semiconductor technology, while achieving sufficient signal bandwidth for RF applications, all in a rugged planar assembly. An example of one embodiment of the basic technology fabrication approach is illustrated in FIGS. 7A to 7F. A silicon carrier substrate is used onto which a thermoplastic polymeric material layer is bonded or laminated (FIG. 7A). The thickness of this thermoplastic can be varied, depending on the thicknesses of the die to be heterogeneously integrated. The completed CMOS, InP, GaN, GaAs, MEMS, etc. devices (i.e., die or microchips) are placed face up on top of the polymer using precision pick and place with automated vision recognition between device features and fiducial marks on the silicon wafer (FIG. 7B). These die can be placed with an accuracy of 1 micron or better. Subsequently, a vacuum is created in a process chamber where the die will be embedded into the thermoplastic. Then the devices are embossed into the thermoplastic material layer using hot embossing technology (FIG. 7C). Hot embossing entails heating the thermoplastic on the carrier wafer and die to be embossed above the glass transition temperature of the thermoplastic material, which is typically around 300 degrees Celsius. Subsequently, the carrier wafer with the die embossed into the thermoplastic is cooled and removed from the embossing process chamber. At this point in the process, there is a planar front surface on the silicon wafer, on which multiple dielectric and metal layers can be fabricated using standard lithographic methods to form complex interconnection schemes between the devices (FIG. 7D through 7F). Suitable materials for the interconnection layers are Al and Au, as well as other, metals and low-temperature deposited oxides and polymer dielectrics as well as other insulating material layers.

The required precision for the pick-and-place operation in this technology depends on the size of electrical connection pads used in the devices to be integrated, and is similar to that of flip-chip assembly. In fact, the operation is simpler than flip-chip, since there is no blind-side assembly (all devices face the same direction). Therefore commercial grade chip assembly equipment will meet or exceed the required precision for this technology.

Figure 8A:
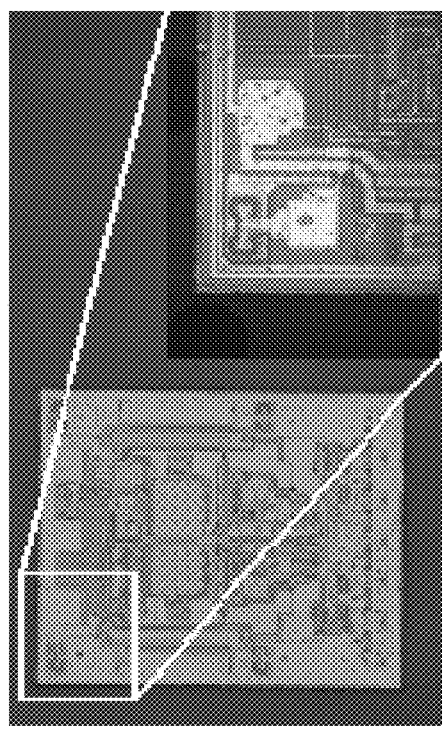
FIG. 8A shows a microscope image of a silicon IC die embossed in a thermoplastic layer and FIG. 8B shows a surface scan of the silicon IC die embossed in the thermoplastic layer.
Figure 8B:
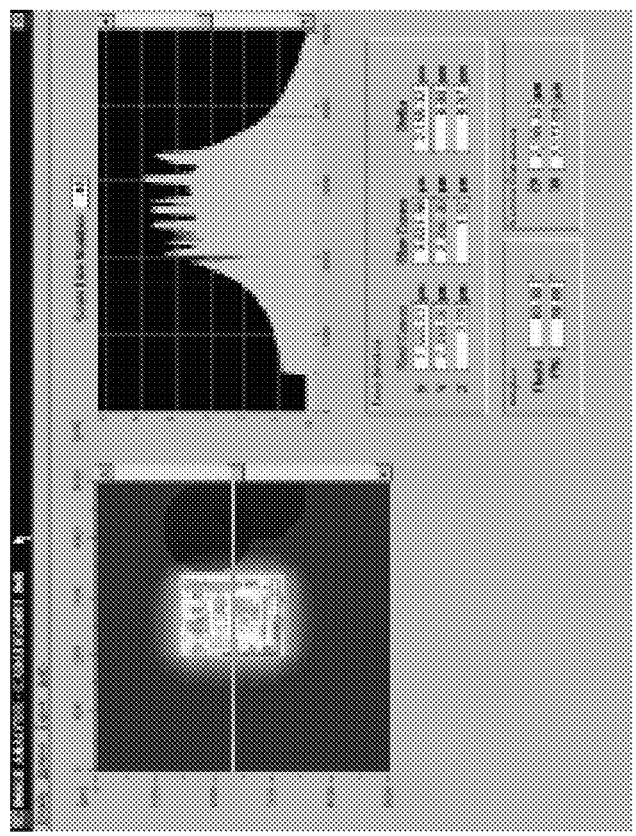

The embossing technology needed is an established technology and can be done using a Jenoptik HEX03 precision embossing tool or similar tool platform. Shown in FIGS. 8A and 8B is a silicon circuit die that was embossed in a thermoplastic polymer material layer. A microscope image (left) and surface profile scan (right) of the embedded die are shown in FIGS. 8A and 8B, respectively. As can be seen, the die is embossed cleanly in the polymer with no contamination of the die surface. Furthermore, the topology of the polymer near the die is very smooth and is comparable in amplitude to the existing topology within the silicon circuit die allowing dielectric and metallization layers to be formed on top with no significant issues in terms of surface discontinuities.

The technology to be used to form the top electrical interconnection structure between the embedded devices is based on thin film technology and standard photolithographic patterning processes. These layers can utilize low (di)electric loss materials such as gold, copper, or any metal, and polyimide or any deposited dielectric material, such as silicon dioxide, oxynitrides, etc., to form a fully integrated device system with multiple interconnection layers.

The metal and dielectric layers can be deposited and patterned using standard thin film and microfabrication techniques. The metal can be deposited using physical vapor deposition techniques, such as sputtering, evaporation, or electroplating techniques. Moreover, any type of metal that is commonly used in thin film and microfabrication technology can be used for performing this fabrication. Likewise, the techniques used to deposit the dielectric layers include: sputtering, evaporation, spin coating, Chemical vapor deposition (CVD), etc. The method used to pattern these layers can be a subtractive process wherein the metal layer is deposited, and then photolithography is performed to place a masking layer of photoresist where the material layer is to be left and then an etch is performed to remove the material in regions not protected by the photoresist masking layer. For some material layers, the method of patterning that can be used is lift-off wherein the photoresist is patterned prior to deposition of the material layer to be patterned and then the material layer is deposited. In areas where the photoresist is not masking the underlying substrate, the material deposition will be directly onto the substrate surface whereas in regions where there is a resist present, the deposited material will deposit on top of the resist. After the material layer has been deposited, the resist is then removed whereby the material deposited onto the resist surface is also removed thereby patterning the material layer.

For devices, such as MEMS-based RF resonators or transducers, in which the device surface must not be covered, special provisions can be made in the process to ensure that no physical contact is made on the sensitive part of the device surface during initial handling, pick-and-place and the embossing operations. This is achieved simply by utilizing properly shaped collets and embossing tools. For the interconnection structure, a temporary protection material is deposited on the sensitive MEMS device area, which is subsequently removed upon completion of the device interconnection processes. A suitable temporary material is dry-film photo resist, which can be applied in layers as thin as 15 um or less[4]. A protection layer of this thickness has minimal effect on the fabrication of the surrounding interconnection structure.

[4] DuPont Riston Special FX Series—FX515 Data Sheet. DuPont Electronic Technologies, Inc. http://www2.dupont.com/Imaging_Materials/en_US/assets/downloads/datasheets/Fx515.pdf In comparison to flip-chip assembly the proposed technology offers advantages in thermal management. Since the thermoplastic layer thickness can be controlled tightly, it is possible through tailoring of the device die thicknesses and precision embossing to reduce the polymer thickness between the silicon carrier substrate and the device die to 25 um or less. With polymer layers that thin, excellent heat dissipation can be realized to the carrier substrate. Thermoplastics with thermal conductivities as high as 110 W/m/K[5] are available, which for 25 um thickness corresponds to a power density dependent temperature increase of just 0.23 K/(W/mm$^2$). The advantage in thermal management of this approach over flip-chip assembly is that only the surface (the back of the carrier substrate) is the target of heat removal, and not both sides of the assembled structure. Further dramatic improvements in thermal package resistance can be realized with the use of metallic or SiC carrier substrates.

[5] Xyloy M950 Injection molding Data Sheet. Cool Polymers, Inc. http://www.coolpolymers.com/Xyloy950.asp An additional feature of the process as illustrated in FIGS. 7A to 7F is the ability to open the thermoplastic layer and carrier substrate under a specific device as shown in FIGS. 7A to 7C. The carrier wafer can be etched with a through-hole and the thermoplastic can have a hole patterned through its thickness as well. Subsequently, the carrier wafer and thermoplastic wafer are aligned to one another and then bonded or laminated together (FIG. 7A). This feature can be utilized to incorporate devices with back side cavities, as seen in many MEMS sensors, and to provide for electrical or an even lower thermally resistive contact to the backside of the device, such as RF ground planes and cooling paths for high power devices.

Another embodiment of the heterogeneous integration is shown in FIG. 9. A carrier wafer has a thin film of metal deposited onto the surface (FIG. 9A). A relatively soft metal layer is then deposited and patterned as shown in FIG. 9B. This metal could be a material like Indium or a solder material that has a low melting point temperature. A thermoplastic layer (FIG. 9C) is patterned to make hole through its thickness in the desired locations (FIG. 9D). The thermoplastic layer is aligned and then bonded or laminated to the carrier wafer (FIG. 9E) such that the patterned soft metal on the wafer surface is located where the through-holes are in the thermoplastic layer. Using a pick-and-place machine, the die to be embossed into the thermoplastic layer are then accurately positioned onto the top surface of the thermoplastic layer (FIG. 9F). These die can be of virtually any device or technology type. Subsequently, these die are hot embossed into the thermoplastic layer such that their top surfaces are even with the top surface of the thermoplastic layer and the metal layer on the backside of the die that must have backside electrical contact are pushed into physical contact with the buried soft meal layer (FIG. 9G). Then various thin film layers of metals and suitable dielectrics are deposited and patterned to form various electrical interconnects between the various die (FIGS. 9H and 9I).

It should be noted that other combinations of the above described processes can be used in the embodiment. For example, the thermoplastic layer can be patterned with through-holes and then have a soft metal injected into the holes partially filling them with the soft metal material prior to bonding or laminating to the carrier wafer. Obviously other combinations of this process are possible.

An advantage of the proposed approach is that design considerations for bond pad locations within devices to allow flip-chip assembly of die of dissimilar size is eliminated or much reduced. There are situations where device-to-device connection lengths are critical, and pad locations must be optimized accordingly, to minimize delay times, signal loading, electromagnetic interference, and other such effects. However, in many cases the proposed planar integration technology is simply adapted to work with existing device designs to realize complete complex systems with widely divergent device material bases without costly redesigns and modifications on the device level. Since the device technologies and system level integration technology are effectively decoupled, it makes for an extremely flexible approach in which individual parts of systems can be readily changed or upgraded as that particular device technology evolves. This ensures maximum uncompromised performance on the system level, with instant access to new device improvements without concerns about material compatibility.

Additionally, passive components can easily be fabricated on the wafer onto which the heterogeneous integration was performed.

The result process technology is flexible and customizable for enabling heterogeneous integration that can be used to merge a vast and diverse set of semiconductor technologies and device types (including CMOS, GaAs, SiGe CMOS, InP HBTs, InP HEMTs, GaN HEMTs, SiC devices, any number from a diverse set of MEMS sensors and actuators, and potentially photonics) onto a single silicon, or other material, substrate and onto a substrate of any form factor.

Although the benefits of heterogeneous integration technology have been recognized for some time and are clearly very substantial, there have been significant technological challenges related to fabrication and manufacturing technologies. The present invention overcomes these technical challenges and also provides a technology platform that meets a number of practical goals and objectives that will enable it to be quickly and inexpensively adopted by industry. Therefore, our invention successfully addresses the major heterogeneous integration fabrication issues and is a simple, manufacturable, cost effective, and practical and thereby allow it to rapidly transition into solutions for DoD and commercial products.

Among the specific attributes of the present invention include:

A) A monolithic process technology using high-performance Aluminum Nitride (AlN) thin film layers and metal electrode layers to implement "tunable" filters that are CMOS compatible. An AlN process and device design allowing filter arrays with different center frequencies to be implemented wherein the resonant frequencies of filters is defined by photolithography thereby allowing implementation of filters covering very large frequency ranges. A monolithic tunable AlN filter at 1 GHz with 5% tuning range and quality factor >1000.

B) The ability to integrate discrete GaN switches with our tunable AlN filter allowing frequency selection that is the basis of a versatile, receive front-end module.

C) A complete RF front-end system encompassing silicon CMOS/AlN MEMS signal processing and filtering, SiGe/GaAs/InP RF receiver pre-amplification, and GaN/GaAs RF transmitter power amplification all integrated onto a single silicon carrier substrate. A fully functional integrated monolithic RF radio front-end having a revolutionary small form factor.

C) An AlN device technology that can be used to excite the traditional BAW-mode and Lamb-mode waves that is CMOS compatible. The device configuration includes a single top electrode for BAW resonators (such as FBARs) and two or more sets of top electrodes for Lamb-mode resonators. The metal-AlN-metal stack is made by surface micromachining. An additional fixed electrode underneath the bottom electrode of the resonator stack is added to tune resonator frequencies electrostatically.

D) A monolithic AlN filter set consisting of five fixed-frequency ladder filters with center frequencies at 0.25 GHz, 0.5 GHz, 1 GHz, 2 GHz, and 4 GHz. The resonant frequencies of lamb-mode resonators are defined by photolithography. This allows monolithic fabrication of resonators covering a large frequency range. This is a key demonstration of the circuit complexity that is achieved by AlN technology.

E) A monolithic tunable AlN filter at 1 GHz with 5% tuning range and quality factor >1000.

F) An integrated tunable AlN filter set consisting of two filters with center frequencies of 1 GHz and 1.1 GHz. After characterization and calibration, a multitude of tunable filters can be used to cover a wide frequency range continuously.

G) Discrete GaN switches (e.g., TGS2351 from TriQuint) integrated with the tunable AlN filter set. Selected filters can be switched in and out for frequency selection. This circuit is the basis of a versatile, receive front-end module. The capability of selecting the input frequency bands by integrating only two dies is important to reduce the circuit complexity.

H) An integrated GaN, AlN, SiGe (or GaAs) front-end module at 1 GHz. This module has SPDT GaN switches, two AlN filters centered at 1 GHz and 1.1 GHz and a SiGe HEMT (or GaAs HEMT) LNA (e.g., MGA-16516 from Avago) that covers a frequency range from 0.5 GHz to 1.7 GHz with a noise figure of <0.4 dB.

I) A completely planar heterogeneous process for the integration of dissimilar device materials and devices on a single silicon, or other suitable, substrate. A heterogeneous integration process technology that is sufficiently flexible that it can be used for any semiconductor technology or device type, including semiconductor electronic devices, MEMS, photonics, and nano-devices, thereby affording maximum design freedom. Allows maximum flexibility in terms of device designs, process technologies, and system configurations that can be heterogeneously integrated.

J) A planar heterogeneous process for the integration of dissimilar device materials on a single silicon, or other suitable material, substrate. The process can include two, three of more interconnection levels and allows for signal bandwidth and delay times that meet or exceed the Radio Frequency (RF) application requirements. The process can be performed at low temperature (not to exceed 300° C.) such that it can be used with any device technology with no adverse effects on individual device performance and reliability.

K) A planar heterogeneous integration process that can accommodate a large number of electrical interconnection levels and allow for signal bandwidth and delay times that meet or exceed the DARPA (Defense Advanced Research Projects Agency) requirements.

L) A planar heterogeneous integration process that is performed at low temperatures (not to exceed 300° C.) such that it can utilize most any device technology with no adverse effects on individual device performance and reliability.

M) A planar heterogeneous integration process that can be used for any size substrate (e.g., 100-mm, 150-mm, 200-mm, 300-mm, diameter or larger) and on substrates having non-standard form factors (e.g., circular, square, rectangular, etc.). Therefore, this technology is scalable.

N) A planar heterogeneous integration process that has a very low cost in terms of development costs (e.g., NRE (non-recurring engineering)), foundry set-up costs (e.g., low equipment costs), and on-going operational costs and also uses existing process tool technologies.

O) Process integration "plug-ins," allowing for the integration of MEMS, or other devices, requiring no additional material on the front surface and that result in no deterioration in device or system performance as a result of the integration process.

P) A planar heterogeneous process for the integration of dissimilar device materials on a single silicon carrier substrate having excellent Radio Frequency (RF) and thermal management performance characteristics for most electronic applications.

Q) A planar heterogeneous process that is not only enormously flexible in the diversity of semiconductor and device technologies it can accommodate, but can easily be used regardless of the evolution of the semiconductor and device technologies. That is, it will not require major re-works or additional process development as microchip technologies change over time.

R) A planar heterogeneous integration process technology that can accommodate a high level of customization of the technologies used on a single substrate and thereby afford enormous design freedom and low cost. This attribute also allows customization for Multiple Project Wafer (MPW) runs.

S) A planar heterogeneous integration process technology that is a stable and reproducible process (i.e., is manufacturable).

T) A planar heterogeneous integration process technology that leverages existing semiconductor manufacturing infrastructure (e.g., GaN, InP, GaAs, CMOS, SiGe CMOS, MEMS, photonics foundries).

U) A heterogeneous integration process technology that uses "plug-ins" in the integration process for integration of MEMS, or other devices, that require no additional material on the front surface. The process plug-in shows no deterioration in performance as a result of the integration process.

V) A heterogeneous integration process technology that can be described using a complete set of design rules and design kits for designers to allow higher levels of design control of heterogeneous devices in a single design space. The design rules and design kit allow easier and simpler access to the technology.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A communication system front-end architecture in which a diverse set of semiconductor technologies and device types are integrated onto a single material substrate, the front-end architecture comprising:

a tunable microelectromechanical systems (MEMS) filter/duplexer formed from aluminum nitride (AlN) resonators for filtered, bi-directional communication over an antenna, a first bank of gallium nitride (GaN) switches connected between the filter/duplexer (receive channel), power amplifier (transmit channel) and the antenna, a silicon-germanium (SiGe), indium phosphide (InP) or gallium arsenide (GaAs) high electron mobility transistor (HEMT) tunable low noise amplifier (LNA), a second bank of GaN switches connected between the filter/duplexer and the low noise amplifier, a tunable microelectromechanical systems (MEMS) image filter formed from AlN resonators and connected to the low noise amplifier, a SiGe mixer for combining or mixing frequencies, the mixer including a SiGe phase locked loop (PLL) control system with a voltage controlled oscillator (VCO), a SiGe bipolar junction and complementary metal-oxide-semiconductor (BiCMOS) or silicon complementary metal-oxide-semiconductor (CMOS) or an indium phosphide (InP) analog to digital converter (ADC) and digital to analog converter (DAC), a silicon (Si) field programmable gate array (FPGA) for reprogramming the front-end architecture for different applications, the field programmable gate array being connected to the analog to digital converter and the digital to analog converter, a SiGe or InP tunable pre-amplifier connected to the mixer, a plurality of high-Q passives implemented using three level thick metallization on a fused-silica substrate and being connected to an output of the tunable pre-amplifier, a GaN reconfigurable power amplifier connected to the high-Q passives and the first bank of GaN switches, and a mixed-signal (analog and digital signals) control circuit, based on FPGA, silicon microcontroller or custom digital integrated circuit is connected to all tunable/switched devices within the system including mixer, tunable image filter, the analog to digital converter and the digital to analog converter, the tunable pre-amplifier and the digital control, to the tunable low noise amplifier, the high-Q passives, the first and the second banks of GaN switches, the reconfigurable power amplifier, and antenna.

2. The front-end architecture of claim 1, wherein the first and second banks of GaN switches are used to switch in/out passive components to provide versatility to control waveforms in a specified range, and wherein the first bank of switches also switch between receive and transmit channels.

3. The front-end architecture of claim 1, wherein each of the tunable AlN resonators is thin-film AlN radio frequency (RF) resonator which includes a completely released AlN deposited on a uniform ground metallization electrode and two sets of top electrodes used to generate an in-plane mode of sound wave excitation.

4. The front-end architecture of claim 3, wherein the thin-film AlN RF resonator, when excited with the two sets of top electrodes and ground electrode, generates Lamb-mode sound waves.

5. The front-end architecture of claim 3, wherein the tunable, thin-film AlN RF resonator has a fourth electrode below the ground electrode for resonant frequency tuning.

6. The front-end architecture of claim 3, wherein the tunable, thin film AlN resonator is tuned by controlling the strain in the piezoelectric AlN thin film by applying electrical voltage between the ground electrode in contact with AlN thin film, and the fourth electrode across the air gap.

7. The front-end architecture of claim 3, wherein the one set of top electrodes are used to drive the resonator, and wherein the other set of top electrodes is used for sensing, thereby forming an output port of the resonator.

8. The front-end architecture of claim 1, wherein the AlN resonators are tunable, high-quality (high-Q) resonators, so as to have low damping, that combined in a ladder filter configuration.

9. The front-end architecture of claim 8, wherein the tunable, high-Q AlN resonators combined in the ladder filter configuration have center frequencies within a range of 0.8 GHz to 5 GHz and quality factors greater than 1000.

10. The front-end architecture of claim 8, wherein the AlN resonators connected in series have a resonance frequency of $\omega_r$ that is tuned to an anti-resonance frequency $\omega_a$ of the AlN resonators connected as shunt resonators.

11. The front-end architecture of claim 8, wherein the AlN resonators combined in the ladder filter configuration have tunable bandwidth and center frequencies.

12. The front-end architecture of claim 1, wherein AlN resonators are integrated with CMOS wafers by post-processing of the CMOS wafers, wherein deposition of an AlN material layer is performed at temperatures below 400° C. so as to be CMOS compatible.

13. The front-end architecture of claim 1, wherein the ADC is a low-power, two-stage successive approximation register-type (SAR-type) ADC.

14. The front-end architecture of claim 1, wherein the ADC has a bandwidth of 100 MHz, a signal-to-noise (SNR) greater than 65 dB at 250 mega samples per second (MS/s) and a power consumption less than 10 mW.

15. A method of fabricating a communication system front-end architecture using planar heterogeneous integration of a single material carrier substrate on which a diverse set of semiconductor technologies and device types are integrated on the substrate, the method comprising the steps of:

bonding or laminating a thermoplastic polymeric material layer onto the carrier substrate, placing on top of the thermoplastic polymeric layer completed substrate die, each of which may comprise one or more of the following technologies, including: bipolar junction and complementary metal-oxide-semiconductor (BiCMOS), complementary metal-oxide-semiconductor (CMOS), high electron mobility transistor (HEMT), heterojunction bipolar transistor (HBT), silicon-germanium (SiGe), indium phosphide (InP), gallium nitride (GaN), gallium arsenide (GaAs), aluminum nitride (AlN), silicon (Si), silicon-germanium (SiGe), and/or microelectromechanical systems (MEMS) devices, creating a vacuum in a process chamber in which the devices placed on the thermoplastic polymeric layer are placed onto the surface of the thermoplastic polymeric layer, embossing the devices to embed them into the thermoplastic polymeric layer using a hot embossing technology, cooling and removing from the embossing process chamber the carrier substrate with the devices embossed into the thermoplastic polymeric layer, fabricating a plurality of dielectric, oxide and/or metal layers on the planar front surface of the carrier substrate and die that have been embossed into the thermoplastic layer to form electrical interconnection schemes between the devices embossed into the thermoplastic polymeric layer.

16. The method of claim 15, wherein the thermoplastic polymeric layer thickness is varied, depending on the substrate thicknesses of the devices to be heterogeneously integrated.

17. The method of claim 15, wherein the dielectric and metal layers are fabricated on the carrier substrate using standard lithographic methods.

18. The method of claim 15, wherein the devices placed on top of the thermoplastic polymeric layer are dies or microchips.

19. The method of claim 15, wherein the devices placed on top of the thermoplastic polymeric layer are placed face up.

20. The method of claim 15, wherein the metal interconnection layers are formed from aluminum (Al) and/or gold (Au).

21. The method of claim 15, wherein the dielectric interconnection layers are formed from polymer dielectrics or insulating materials.

22. The method of claim 15, wherein the oxide interconnection layers are formed from low-temperature deposited oxides.

23. The method of claim 15, wherein the devices placed on top of the thermoplastic polymeric layer are placed using precision pick and place with automated vision recognition between device features and fiducial marks on the carrier substrate.

24. The method of claim 15, wherein the devices placed on top of the thermoplastic polymeric layer are embossed using a Jenoptik HEX03 precision embossing tool platform.

25. A method of fabricating a communication system front-end architecture using planar heterogeneous integration of a single material carrier substrate on which a diverse set of semiconductor technologies and device types are integrated on the substrate, the method comprising the steps of:

depositing a thin film of metal onto a surface of the carrier substrate, depositing onto the thin film of metal a soft metal layer and then and patterning the soft metal layer, patterning a thermoplastic polymeric material layer to make at least one hole through its thickness in at least one predetermined location, aligning and then bonding or laminating the patterned thermoplastic polymeric material layer onto the carrier substrate, such that the patterned soft metal on a surface of the thin film of metal on the carrier substrate is located where the at least one through-hole is located in the thermoplastic layer, placing on top of the thermoplastic polymeric layer a plurality of dies having a metal layer on a back side, the dies being completed bipolar junction and complementary metal-oxide-semiconductor (BiCMOS), complementary metal-oxide-semiconductor (CMOS), high electron mobility transistor (HEMT), heterojunction bipolar transistor (HBT), silicon-germanium (SiGe), indium phosphide (InP), gallium nitride (GaN), gallium arsenide (GaAs), aluminum nitride (AlN), silicon (Si), silicon-germanium (SiGe), and/or microelectromechanical systems (MEMS) devices, embossing the dies to embed them into the thermoplastic polymeric layer using a hot embossing technology, such that their top surfaces are even with the top surface of the thermoplastic layer and pushing the metal layers on the backside of the dies having backside electrical contact with the devices into physical contact with the buried soft metal layer, depositing and then and patterning various thin film layers of metals and dielectrics on the planar front surface on the thermoplastic layer and die that have been embossed into the thermoplastic layer to form various electrical interconnects between the plurality of dies.

26. The method of claim 25, wherein the soft metal is indium or a solder material that has a low melting point temperature.

27. The method of claim 25, wherein the dies embossed into the thermoplastic layer are positioned onto the top surface of the thermoplastic polymeric layer using a pick-and-place machine.

28. The method of claim 25, wherein the thermoplastic polymeric layer is patterned with through-holes and then the soft metal is injected into the holes partially filling them with the soft metal prior to the thermoplastic polymeric layer being bonded or laminated to the carrier wafer.

29. The method of claim 25, wherein the carrier substrate and thermoplastic layer have at least one coincidental opening through their thickness.

30. The method of claim 29, wherein the at least one coincidental opening is formed in the thermoplastic layer and carrier substrate prior to bonding or lamination.

31. The method of claim 30, wherein precision alignment is utilized prior to bonding or lamination of the thermoplastic layer and carrier substrate to align the at least one opening through their thicknesses.

32. The method of claim 29, wherein the at least one coincidental opening is formed in the thermoplastic layer and carrier substrate after bonding or lamination.

33. The method of claim 29, wherein the at least coincidental opening is located under at least one of the devices to be embedded in the thermoplastic layer.

34. The method of claim 29, wherein upon embossing of the devices the at least one opening through the thermoplastic layer and carrier substrate thicknesses is filled with a filling material.

35. The method of claim 34, wherein filling is achieved using any combination of thin film deposition and electroplating.

36. The method of claim 34, wherein filling is achieved using dispensing and subsequent solidification of a liquid material.

37. The method of claim 34, wherein filling is achieved using thin film deposition and dispensing and subsequent solidification of a liquid material.

38. The method of claim 34, wherein the filling material is electrically conductive.

39. The method of claim 34, wherein the filling material is thermally conductive.

40. The method of claim 34, wherein the filling material is both electrically and thermally conductive.

41. The method of claim 25, wherein fiducial marks are formed on the carrier substrate prior to bonding or lamination of the thermoplastic layer.

42. The method of claim 41, wherein the fiducial marks are utilized in placement of the devices to be embedded to achieve high precision registration.

43. The method of claim 25, wherein fiducial marks are formed on the carrier substrate prior to bonding or lamination of the thermoplastic layer.

44. The method of claim 43, wherein the fiducial marks are utilized in placement of the devices to be embedded to achieve high precision registration.

* * * * *